US008024686B2

(12) United States Patent
Ispir et al.

(10) Patent No.: US 8,024,686 B2
(45) Date of Patent: Sep. 20, 2011

(54) RETIMING OF MULTIRATE SYSTEM

(75) Inventors: Mustafa Ispir, Cayyolu (TR); Levent Oktem, Cayyolu (TR)

(73) Assignee: Synopsys, Inc., Mountain View, CA (US)

( * ) Notice: Subject to any disclaimer, the term of this patent is extended or adjusted under 35 U.S.C. 154(b) by 477 days.

(21) Appl. No.: 12/323,326

(22) Filed: Nov. 25, 2008

(65) Prior Publication Data

US 2010/0131912 A1 May 27, 2010

(51) Int. Cl.
*G06F 17/50* (2006.01)
*G06F 9/455* (2006.01)

(52) U.S. Cl. ........ 716/113; 716/108; 716/132; 716/134; 716/136; 703/13; 703/14; 327/8; 327/21; 327/44; 327/46; 327/116; 327/119; 327/141; 327/144; 327/145; 327/150

(58) Field of Classification Search .................. 716/108, 716/113, 132, 134, 136; 703/13–14; 327/8, 327/21, 44–46, 116, 119, 141, 144–145, 327/150

See application file for complete search history.

(56) References Cited

U.S. PATENT DOCUMENTS

| 7,093,204 | B2 * | 8/2006 | Oktem et al. ............... 716/103 |
| 7,120,883 | B1 * | 10/2006 | van Antwerpen et al. .... 716/102 |
| 7,162,704 | B2 * | 1/2007 | Oktem ........................ 716/114 |
| 7,786,913 | B2 * | 8/2010 | Waheed et al. ............. 341/143 |
| 7,920,081 | B2 * | 4/2011 | Waheed et al. ............. 341/118 |

* cited by examiner

*Primary Examiner* — Nghia M Doan
(74) *Attorney, Agent, or Firm* — Blakely, Sokoloff, Taylor & Zafman, LLP; Judith A. Szepesi

(57) ABSTRACT

Methods and apparatuses for retiming of multirate system for clock period minimization with a polynomial time without sub-optimality. In an embodiment, a normalized factor vector for the nodes of multirate graph is introduced, allowing the formulation of the multirate graph retiming constraints to a form similar to a single rate graph. In an aspect, the retiming constraints are formulated to allowed the usage of linear programming methodology instead of integer linear programming, thus significantly reducing the complexity of the solving algorithm. The present methodology also uses multirate constraints, avoiding unfolding to single rate equivalent, thus avoiding graph size increase. In a preferred embodiment, the parameters of the multirate system are normalized to the normalized factor vector, providing efficient algorithm in term of computational time and memory usage, without any sub-optimality.

30 Claims, 13 Drawing Sheets

$y[n] = a\, y[n-1] + x[n]$

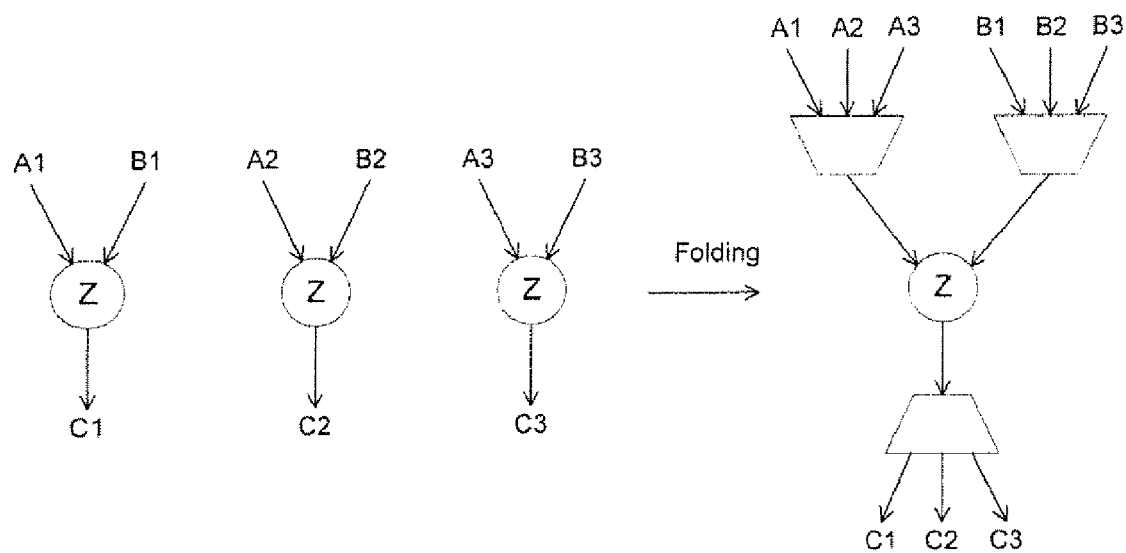
Fig. 3
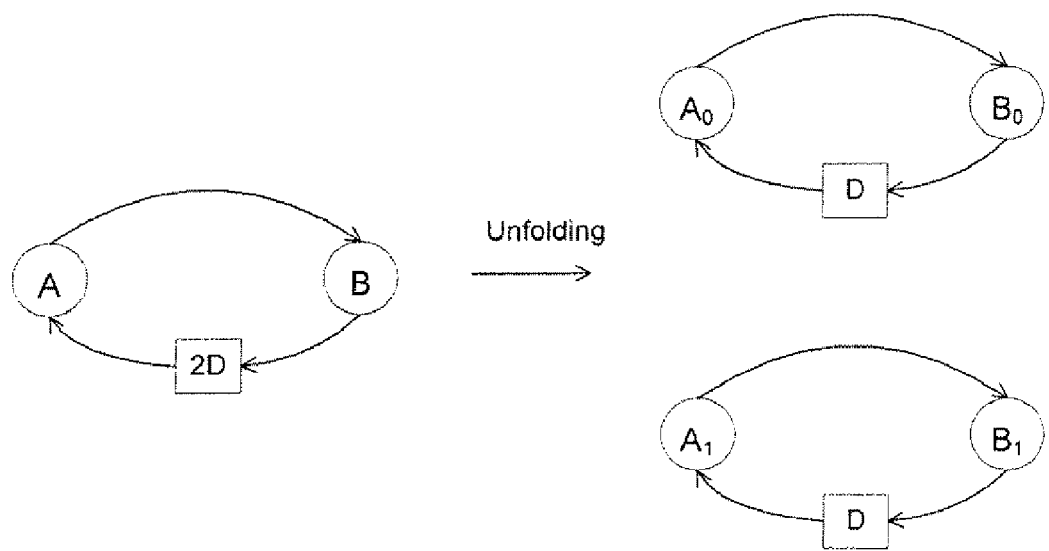
Fig. 4A
Fig. 4B

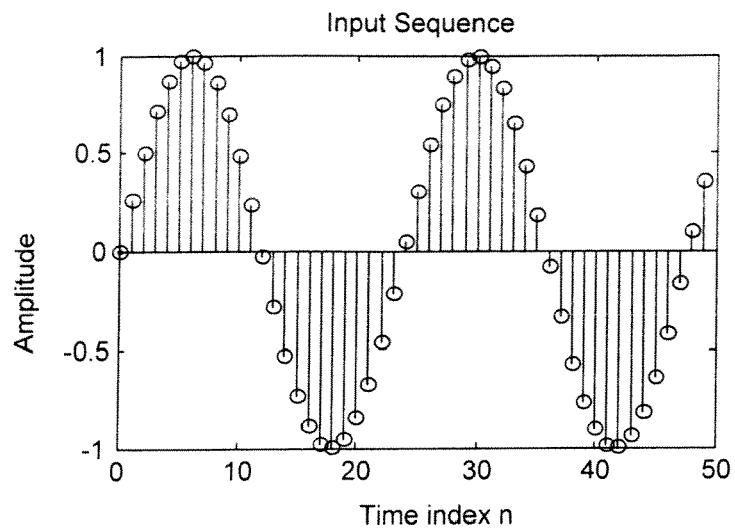
Fig. 6A
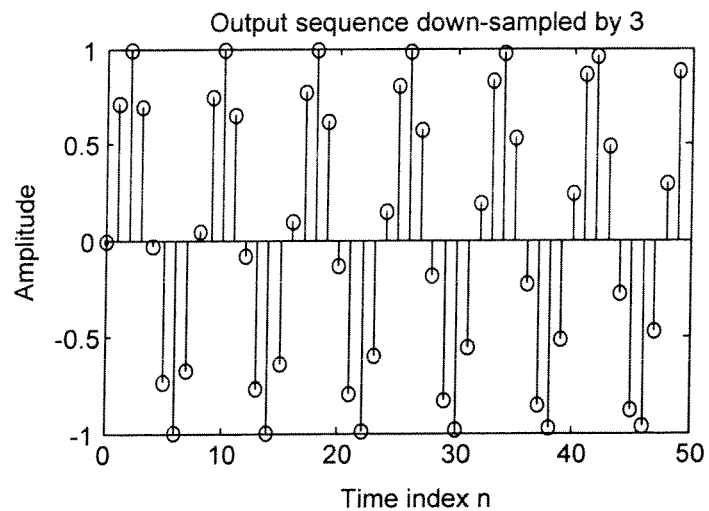
Fig. 6B
x[3k] ⟶ y[3k]
x[3k+1] ⟶ ✗
x[3k+2] ⟶ ✗
Fig. 6C

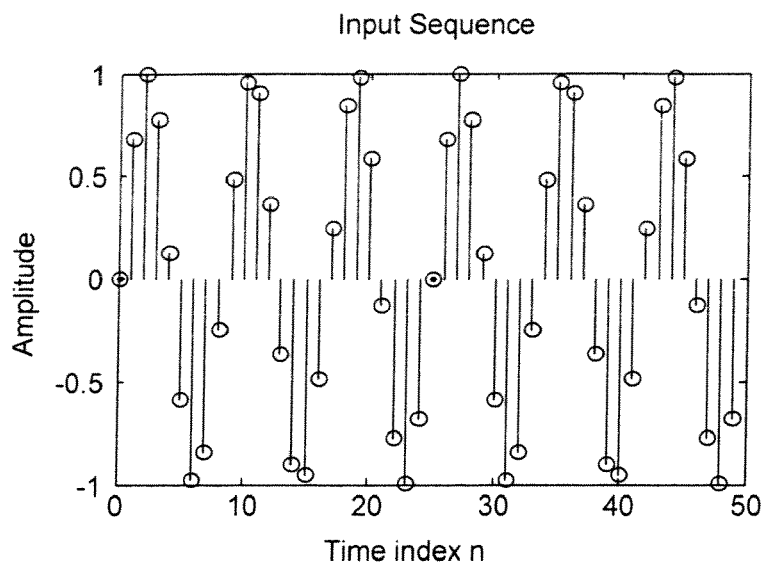
Fig. 7A
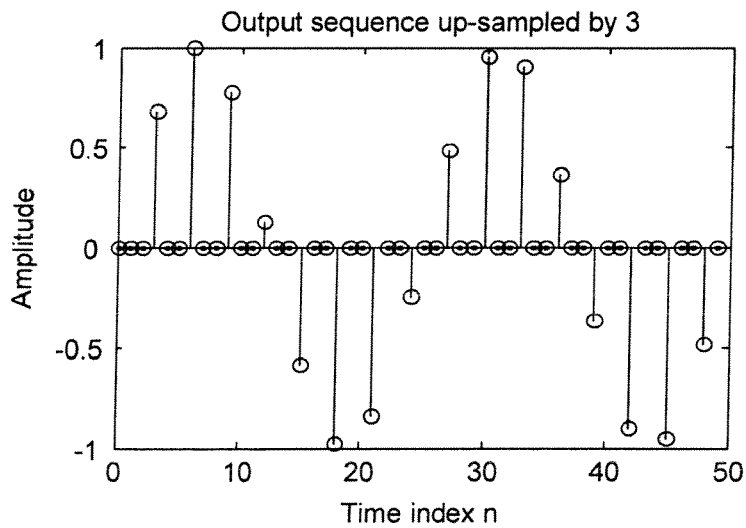
Fig. 7B
$x[3k] \longrightarrow y[3k]$
$0 \longrightarrow y[3k+1]$
$0 \longrightarrow y[3k+2]$
Fig. 7C

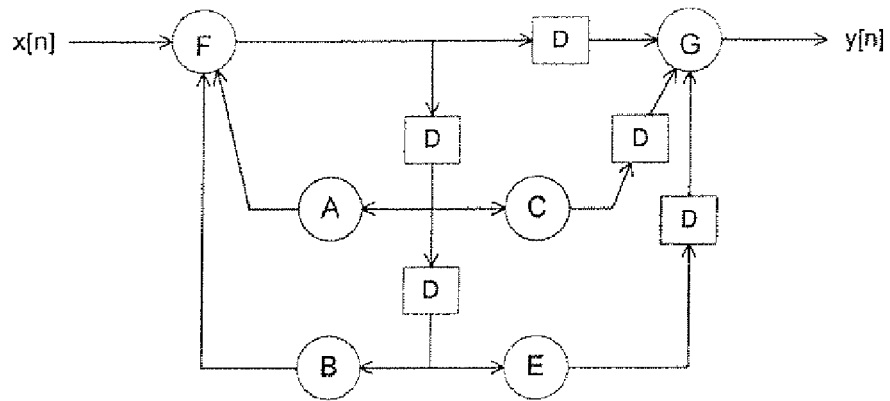
Fig. 11A
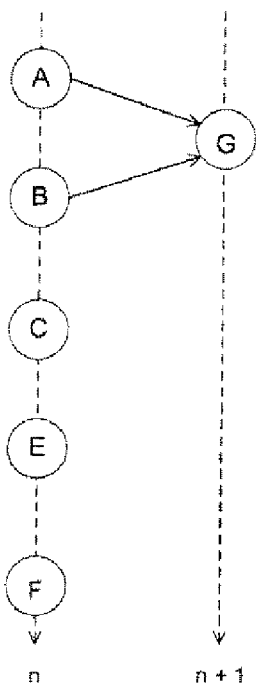
Fig. 11B
| A | F | A | F |
| B | E | B | E |
| C | G | C | G |
Cycle time = 2
Fig. 11C

RETIMING OF MULTIRATE SYSTEM

FIELD OF THE INVENTION

The invention relates to circuit design, and more particularly to retiming of multirate systems.

BACKGROUND

Advances in data flow programs for digital signal processing has provided significant progress in circuit optimization using data flow graphs, especially for parallel computers. A data flow graph representation is a popular hardware and software methodology where algorithms are described as directed graphs with nodes representing computations (or functions or subtasks) and edges representing data paths (communications between nodes). A data flow algorithm is mainly concerned with the flow of data and not with the actual computation process, and is a natural paradigm for describing digital signal processing applications for concurrent implementation on parallel hardware. For concurrent implementations, a task is broken into subtasks which are then scheduled onto parallel processors.

For example, FIG. 1A illustrates a circuit block diagram describing the computation $y[n]=ay[n-1]+x[n]$. This is a feedback function where the computational output $y[n]$ depends on the value of its previous output $y[n-1]$. The block diagram shows a delay block D, which can be a delay register, to store the previous value of the output y. A multiplication block X is provided to multiply the delay output $y[n-1]$ and a constant a. An addition block + is provided to add the input $x[n]$ with the multiplied delay output $ay[n-1]$. A key feature of a circuit block diagram is that the functionality of the circuit can be understood and derived from the circuit block diagram. For example, the computation $y[n]=ay[n-1]+x[n]$ can be calculated from the circuit block diagram of FIG. 1A at a circuit operation level.

FIG. 1B illustrates a data flow graph of this block diagram with node A representing the addition block and node B representing the multiplication block. The edge from B to A (B→A) represents the data path from the multiplication block to the addition block, and the edge from A to B (A→B) represents the data path from the addition block to the multiplication block. The delay D is inserted to the data path from A to B to show that the edge from A to B (A→B) contains one delay (e.g., 1 clock cycle delay). The input branch $x[n]$ and the output branch $y[n]$ are shown in dotted lines, mainly for an illustration of the correlation with the block diagram of FIG. 1A. In practice, the input and output branches are typically not shown in a data flow graph (e.g., FIG. 1C). Alternatively, the delay D can be shown in the vicinity of the edge (FIG. 1C).

Other information can be included in the data flow graph, for example, information related to synchronous data flow graph to show that execution of nodes A and B consumes one data sample and produces output. This is illustrated by a number 1 from the edge coming to node A/B and a number 1 from the edge coming out of node A/B. Each node can have an execution time associated with it, for example, the amount of time required to execute node A (addition computation) is 2 time units (e.g., 2 clock cycles), and the amount of time required to execute node B (multiplication computation) is 4 time units. This is illustrated by a number in parentheses (2) and (4) in the vicinity of nodes A and node B, respectively.

Typically, operations of a data flow graph at a data flow level are operations related only to the data flow without regard to functional or computational operations. For example, the critical path of a data flow graph is defined to be the path with the longest computation time among all paths that contain zero delay. Thus the critical path in the data flow graph shown in FIG. 1B is the path B→A, which requires 6 time units. Optimizing the critical path is an example of optimizing a data flow graph at a data flow level.

The illustrated data flow graph describes a single rate system where all nodes consume one data sample and produce one output relative to a clock cycle. In multirate systems, the number of data samples consumed and produced can be different than 1, such as in a system where the nodes operate at different frequencies or a decimator or an interpolator. For example, a ↓2 decimator rejects every other data sample, thus producing one data output for every 2 data samples consumed. A ↑2 interpolator introduces an addition data output for every data sample, thus producing 2 data outputs for every 1 data sample consumed.

In addition to being natural to digital signal processing, a data flow graph representation has another advantage of generating the same results for any implementations of the data flow description, as long as the integrity of the flow of data is preserved. Thus data flow graph representations can be an indispensable tool in scheduling and mapping circuit design representation onto hardware.

The current data flow graph representations employ nodes and edges, together with using linear programming to optimize the flow of data to achieve a desired clock.

SUMMARY OF THE DESCRIPTION

The present invention relates to methods and apparatuses to design a circuit, and particularly to retiming of multirate systems. The methods can be used to optimize a design for a circuit to achieve an improved design which can then be used to build the circuit. The optimized design can be used to create a net list or other data structure which is then used to program or create a circuit in an integrated circuit.

In an embodiment, the present invention discloses normalizing the retimed solutions for the nodes of a multirate data flow graph. In an aspect, the present invention discloses a normalization factor vector for a multirate data flow graph. The normalized formulation of the multirate retiming problem (e.g., normalization factor vector and/or the normalized retimed solutions) can enable shortest path finding solutions instead of the more complex integer linear programming solutions, and can enable a formulation of the retiming problem of a multirate system in the form of a single rate system.

Single rate retiming is a more extensive studied topic and there exist more efficient optimization algorithms than multirate retiming. With the present formulation in the form of single rate constraints, it can leverage these efficient algorithms and thus can find a better retiming. For example, a retiming may be derived for a single rate system by solving a linear programming problem. Conventional multirate system has different rates on the edges and potentially changes this to a more complicated integer linear programming problem. In an embodiment, the present invention formulates the retiming problem of a multirate system to enable linear programming solutions and/or shortest path finding solutions though normalizing the different rates on the edges of the multirate system.

In an embodiment, the present invention discloses an algorithm for retiming of multirate DSP system for clock period minimization, which in many cases, can be solved with polynomial time and without any sub-optimality. The present multirate retiming methodology that can be solved with shortest path algorithm, eliminating integer linear programming which is computational more complex, and can be easier to implement and less error prone. With the present method, practical solvable multirate system size, e.g., DSP system, increases significantly, estimated to be at least an order of magnitude. By working directly with the multirate system, the present method also does not suffer from the issue of graph size increase and additional complexity associated with system unfolding.

In an embodiment, the present method introduces a normalization factor for each node or edge of the multirate data flow graph. In an aspect, the normalized factor serves to normalize the various frequencies within the multirate system. With the normalized factor, an upsampler node or a downsampler node can be treated as a single rate node, enabling the utilization of single rate formulation on the setting the retiming constraints for a multirate system without unfolding. For example, the normalization factor can be an integerized relative period vector $T_n$, proportional to the least common multiple of the frequencies of the outgoing edges of each node. The parameters of the multirate system are then normalized using the normalization factors, and the normalized parameters establish a system of inequality constraints for the retiming solutions. A multirate consistency constraint can be introduced to impose consistent rate changes within the multirate system. For example, the retimed solution for a node can be normalized with the up rate and/or down rate of the node. In an aspect, the edge delay for an edge is normalized by the normalization factor for the source node of this edge. The target clock period is normalized to a plurality of target clock periods, each for a path, which can be calculated by the normalization factor for the end node of the path. The retiming constraints for feasibility for the present multirate system are then constructed from the normalized retimed solutions using the normalized edge delays. The retiming constraints to achieve the target clock period can be constructed using the normalized target clock period, together with the retiming constraints to obey the multirate consistency. Other alternatives to the above implementation of normalized parameters of the multirate system can be considered.

The present retiming algorithm for multirate system can have simplicity advantages, does not increase the graph size since there is no unfolding transformation, solves multirate constraints using multirate graph, does not require integer linear programming methodology, eliminates superfluous constraints, does not have any sub-optimality, and provide optimal on clock period setting.

The present invention includes methods and apparatuses which perform these methods, including data processing systems which perform these methods, and computer readable media which when executed on data processing systems cause the systems to perform these methods.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings in which like references indicate similar elements.

FIG. 3 illustrates an exemplary folding transformation.

FIGS. 4A-4B illustrate an exemplary unfolding transformation.

FIGS. 6A-6C illustrate an exemplary downsampler.

FIGS. 7A-7C illustrate an exemplary upsampler.

FIGS. 11A-11C illustrate an exemplary optimized system using parallel processors.

DETAILED DESCRIPTION OF THE PREFERRED EMBODIMENTS

The following description and drawings are illustrative of the invention and are not to be construed as limiting the invention. Numerous specific details are described to provide a thorough understanding of the present invention. However, in certain instances, well known or conventional details are not described in order to avoid obscuring the description of the present invention. References to "an" or "one embodiment" in the present disclosure are not necessary to the same embodiment; and, such references mean at least one.

At least one embodiment of the present invention seeks to formulate a retiming problem of a multirate digital signal processing system to a form similar to a single rate retiming problem, which a computational shortest path algorithm can be used to solve it. Single rate retiming problem formulation is much simpler, can be solved by shortest path algorithm instead of integer linear programming, and possesses many useful results regarding delay counts of paths and cycles. In an aspect, the present invention formulates the multirate system directly without unfolding transformations, thus retain multirate system architecture and avoiding the difficult re-transformations from single rate back to multirate.

In an embodiment, the present invention introduces normalized parameters, for example, normalized retimed solutions, for the multirate system. In an aspect, the present invention introduces normalization factors for the nodes of a multirate system and normalizes the parameters of the multirate system to the normalization factors. The normalization parameters allow the setting of constraint inequalities for the retiming problems of the multirate system with unit coefficients (i.e., 1) for the retimed solutions, thus enabling the solving of the normalized constraint inequalities of the multirate system using linear programming/shortest path algorithm, instead of integer linear programming. Linear programming solution is much simpler, with optimizable shortest path algorithm.

Many of the methods of the present invention may be performed with a digital processing system, such as a conventional, general-purpose computer system. Special purpose computers, which are designed or programmed to perform only one function, may also be used.

Figure 1A:
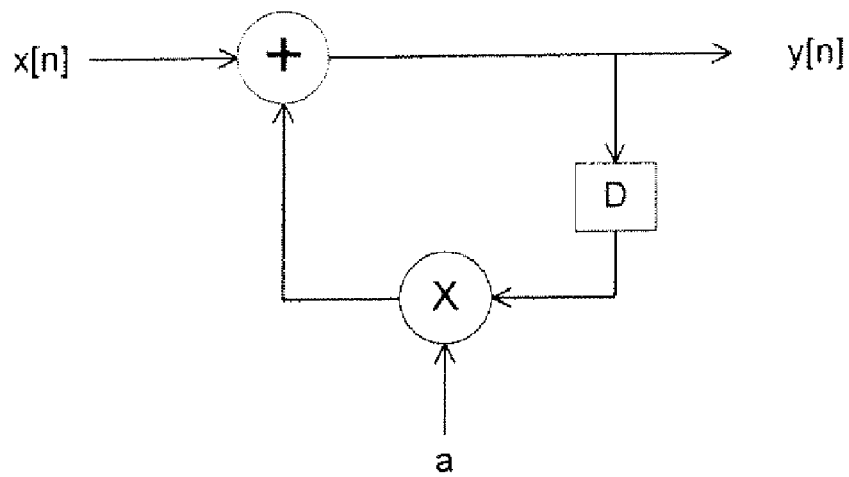
FIGS. 1A-1C illustrate exemplary representations of a design with circuit schematic and data flow graph.
Figure 1B:
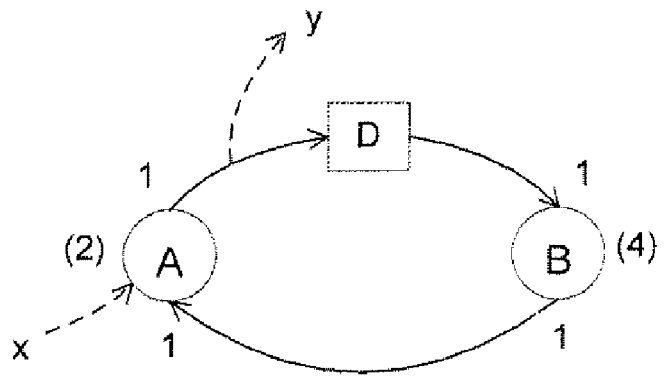
Figure 1C:
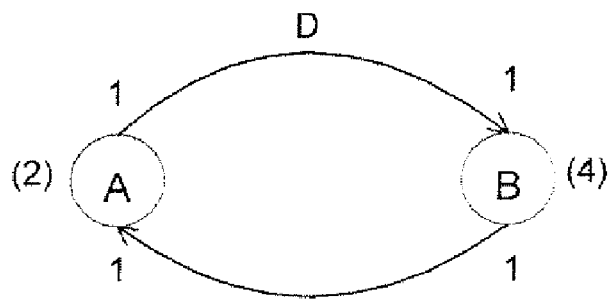
Figure 2:
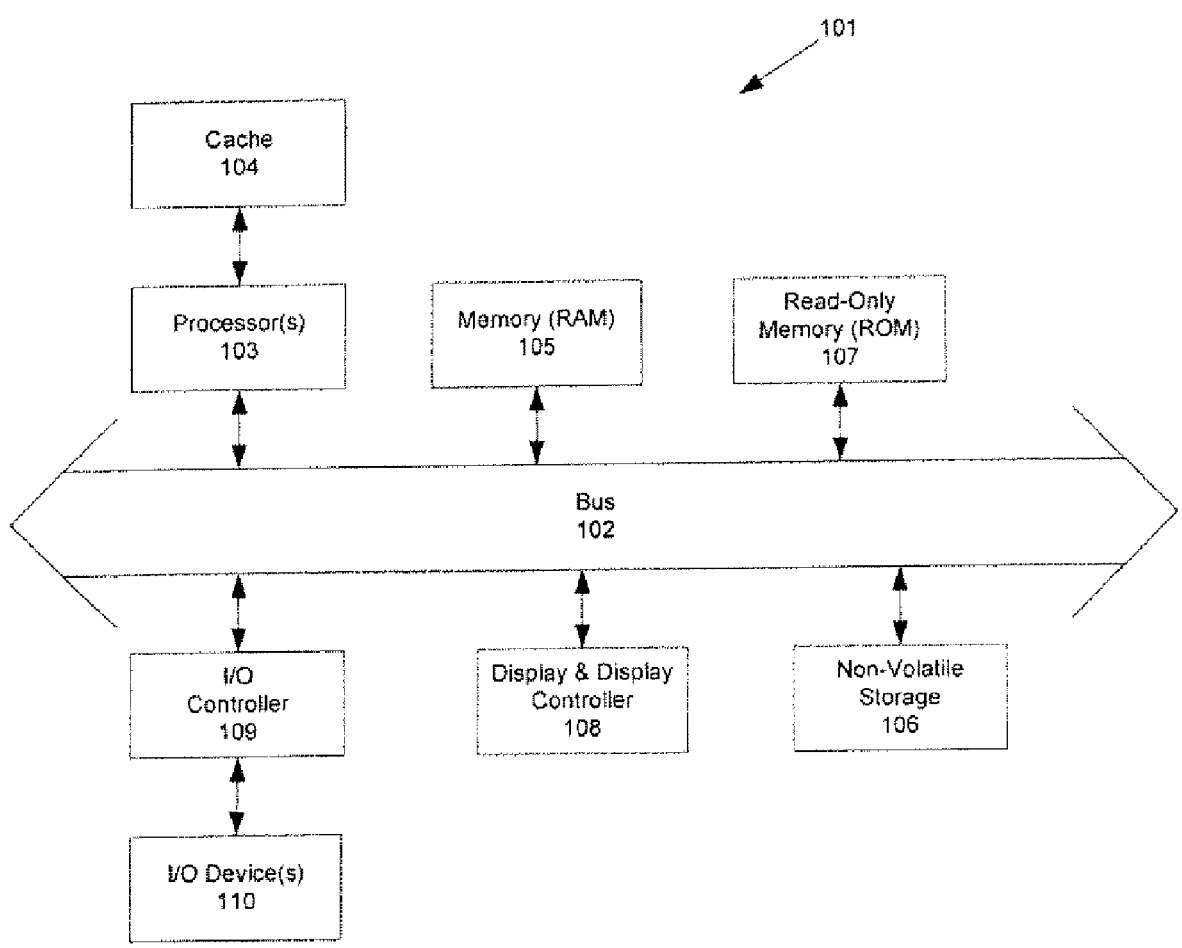
FIG. 2 shows a block diagram example of a data processing system which may be used with the present invention.

FIG. 2 shows one example of a typical computer system which may be used with the present invention. Note that while FIG. 2 illustrates various components of a computer system, it is not intended to represent any particular architecture or manner of interconnecting the components as such details are not germane to the present invention. It will also be appreciated that network computers and other data processing systems which have fewer components or perhaps more components may also be used with the present invention. The computer system of FIG. 2 may, for example, be a Sun workstation, or a personal computer (PC) running a Windows operating system, or an Apple Macintosh computer.

As shown in FIG. 2, the computer system 101, which is a form of a data processing system, includes a bus 102 which is coupled to a microprocessor 103 and a ROM 107 and volatile RAM 105 and a non-volatile memory 106. The microprocessor 103 is coupled to cache memory 104 as shown in the example of FIG. 2. The bus 102 interconnects these various components together and also interconnects these components 103, 107, 105, and 106 to a display controller and display device 108 and to peripheral devices such as input/output (I/O) devices which may be mice, keyboards, modems, network interfaces, printers, scanners, video cameras and other devices which are well known in the art. Typically, the input/output devices 110 are coupled to the system through input/output controllers 109. The volatile RAM 105 is typically implemented as dynamic RAM (DRAM) which requires power continually in order to refresh or maintain the data in the memory. The non-volatile memory 106 is typically a magnetic hard drive or a magnetic optical drive or an optical drive or a DVD RAM or other type of memory systems which maintain data even after power is removed from the system. Typically, the non-volatile memory will also be a random access memory although this is not required. While FIG. 2 shows that the non-volatile memory is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface. The bus 102 may include one or more buses connected to each other through various bridges, controllers and/or adapters as is well known in the art. In one embodiment the I/O controller 109 includes a USB (Universal Serial Bus) adapter for controlling USB peripherals, and/or an IEEE-1394 bus adapter for controlling IEEE-1394 peripherals.

It will be apparent from this description that aspects of the present invention may be embodied, at least in part, in software. That is, the techniques may be carried out in a computer system or other data processing system in response to its processor, such as a microprocessor, executing sequences of instructions contained in a memory, such as ROM 107, volatile RAM 105, non-volatile memory 106, cache 104 or a remote storage device. In various embodiments, hardwired circuitry may be used in combination with software instructions to implement the present invention. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the microprocessor 103.

A machine readable medium can be used to store software and data which when executed by a data processing system causes the system to perform various methods of the present invention. This executable software and data may be stored in various places including for example ROM 107, volatile RAM 105, non-volatile memory 106 and/or cache 104 as shown in FIG. 2. Portions of this software and/or data may be stored in any one of these storage devices.

Thus, a machine readable medium includes any mechanism that provides (i.e., stores) information in a form accessible by a machine (e.g., a computer, network device, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; etc.).

Data flow graph is a technique for programming signal processors based on data flow, and which should ease the programming tasks by enhancing the modularity of code and permit algorithms to be describe more naturally. In addition, data flow processing provides concurrent implementation of DSP applications on parallel hardware. Typical data flow optimizations to be summarized below include pipelining, retiming, unfolding and folding. Detailed descriptions of data flow graph techniques can be found in "*VLSI Digital Signal Processing Systems: Design and Implementation*" by Keshab K. Parhi, Wiley-Interscience, 1999.

A transformation of data flow graph is folding where multiple operations are time multiplexed to a single functional unit. By executing multiple operations in only one functional unit, the number of functional units can be reduced, resulting in a reduction in chip area. The tradeoff of chip area reduction is the increase in frequency where the time multiplexed functional units have to run at multiple clock frequency values. Folding algorithm can be implemented for single or multiple clocks. Since folding changes clock frequency of the functional units, multirate system can be used to further reduce the chip area than the single rate system.

FIG. 3 illustrates the folding transformation concept, where three identical functional units (representing by same node Z) run on different inputs and generate different outputs. The folding transformation reduces the number of functional units to one, and introduces a number of multiplexers for the inputs and outputs for the remaining functional unit. The folding factor is 3, meaning three functional units are folded into one. The clock frequency for the remaining functional unit is likewise increase by the same folding factor, with the inputs and outputs are time multiplexed by the control signals of the multiplexers.

Another optimization transformation of data flow graph is unfolding, where new programs are created to describe more than one iteration of the original program. For example, unfolding a data graph by a factor of 2 describes 2 consecutive iterations of the data graph. Unfolding can reveal hidden concurrencies so that the design can be scheduled to a smaller iteration period, thus increasing the throughput of the implementation. Unfolding can also used to design parallel processing architectures from serial processing architectures.

For example, consider a DSP program $y[n]=ay[n-2]+x[n]$ whose data flow graph is shown in FIG. 4A. The samples are considered to be running indefinitely, thus n can go from zero to infinity. If the index n is replaced with 2k and 2k+1, the above program can be represented by 2 following programs which describe 2 consecutive iterations:

$$y[2k]=ay[2k-2]+x[2k]$$

$$y[2k+1]=ay[2k-1]+x[2k+1]$$

For example, for k=3, the 2 equations are $y[6]=ay[4]+x[6]$ and $y[7]=ay[5]+x[7]$, which are the same for the original program with n=6 and n=7. The data flow graph representation for the unfolding transformation is shown in FIG. 4B.

Figure 5A:
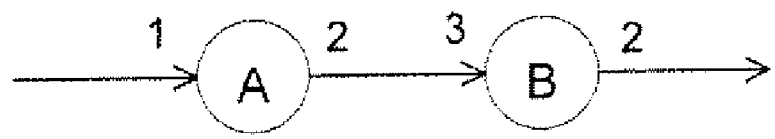
FIGS. 5A-5C illustrate another exemplary unfolding transformation.
Figure 5B:
Figure 5C:
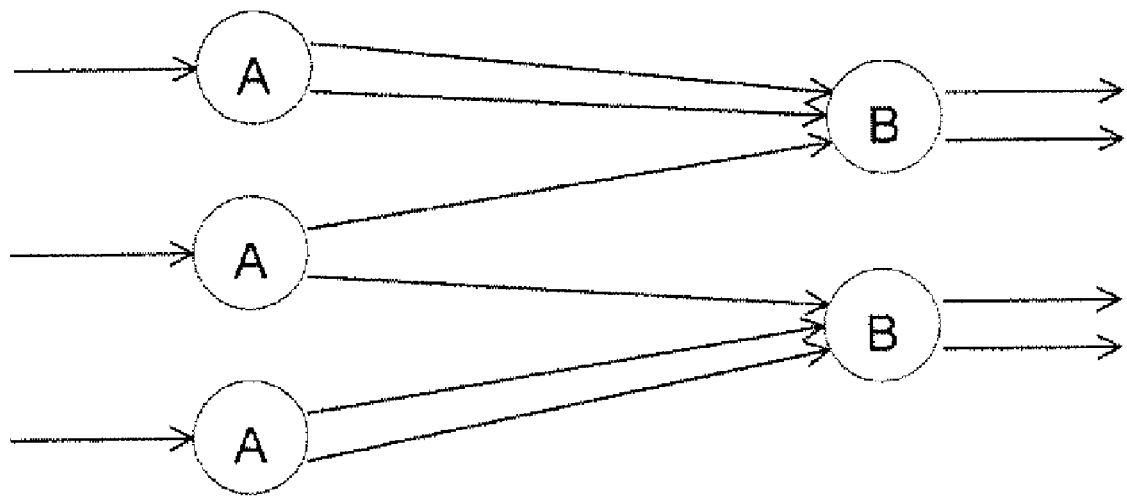

Unfolding transformation can be used to unfold multirate system to single rate system. FIG. 5A illustrates a data flow graph representation of a multirate system, comprising nodes A and B. The numbers associated with a node represent the input and output samples of that node. For example, node A takes one input data and generates two output data, and node B takes three input data and generates two output data, as shown in FIG. 5B. FIG. 5C illustrates an unfolding transformation to convert the multirate data graph of FIG. 5A to a single rate data graph where the nodes are duplicated and the outputs of node A are matched with the inputs of node B.

Multirate transformations include upsamplers and downsamplers. FIG. 6A illustrates an exemplary sample sine wave input sequence with time index n. FIG. 6B illustrates a downsampler by 3 where two samples are terminated for every three sample inputs. The sine frequency of the output downsampler is reduced by a factor of 3. In terms of data flow graph representation, FIG. 6C illustrates a representation of the downsampler by 3. The index n is replaced by indexes $3k$, $3k+1$ and $3k+2$. Only the output $y[3k]$ corresponded to the input $x[3k]$ is carried to the next stage, while the other two inputs $x[3k+1]$ and $x[3k+2]$ are terminated and not used at all. Since the terminated inputs $x[3k+1]$ and $x[3k+2]$ are not used, they can be optimized away according to embodiments of the present invention.

FIG. 7A illustrates an exemplary sample sine wave input sequence with time index n. FIG. 7B illustrates an upsampler by 3 where two samples are added for every sample input. The sine frequency of the output upsampler is thus increased by a factor of 3. In terms of data flow graph representation, FIG. 7C illustrates a representation of the upsampler by 3. The index n is replaced by indexes $3k$, $3k+1$ and $3k+2$. The output $y[3k]$ is corresponded to the input $x[3k]$, and the other two outputs $y[3k+1]$ and $y[3k+2]$ are generated from zero inputs $x[3k+1]$ and $x[3k+2]$. Since the inputs $x[3k+1]$ and $x[3k+2]$ are zero inputs, they can be optimized according to embodiments of the present invention.

Downsampler can suffer from aliasing since any frequencies present in the original signal will be mapped somewhere in the decimated signal's spectrum. Upsamplers can introduce high frequency images, resulted from rapid variations between successive samples. Thus downsamplers are often preceded by an anti-aliasing filter and upsamplers are often followed by an anti-imaging filter. Other techniques can include polyphase algorithms.

Another transformation is pipelining. Pipelining is an operation at a data flow level, with the pipelining concept originated from water pipe where water is continued sent to the pipe without waiting for the water in the pipe to be out. Pipelining can lead to a reduction in critical data path, which can provide either clock speed increase or power consumption reduction. Pipelining can also be used in parallel processing where multiple outputs are computed in parallel in a clock period.

Figure 8A:
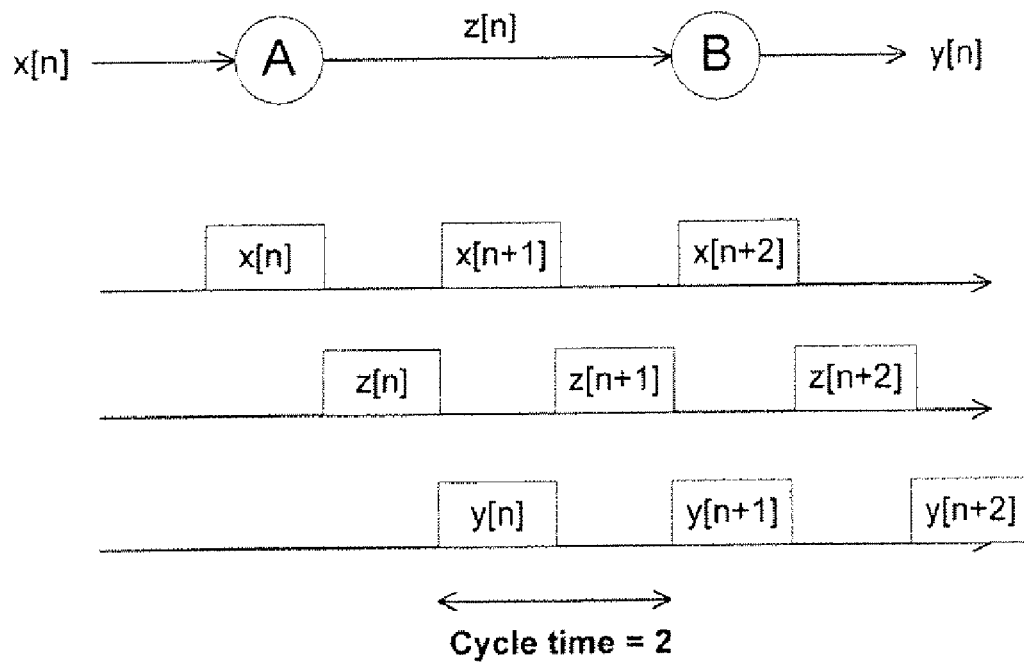
FIGS. 8A-8B illustrate an exemplary pipelining optimization for data flow representation.

Consider a data flow graph shown in FIG. 8A including node A and node B. Signal $x[n]$ is provided to node A, generating output $z[n]$, which is then provided to node B, generating output $y[n]$. Without pipelining, the signal $x[n]$ has to propagate all the way to $y[n]$, processed by both nodes A and B before the next signal $x[n+1]$ can be sent. As shown in FIG. 8A, the delay between input signal $x[n]$ and intermediate signal $z[n]$ is the processing time of node A. Assuming that there is no delay in the signal path from node A to node B, signal $z[n]$ appears immediately at input of node B after coming out of node A. And similarly, the delay time between signal $z[n]$ and output signal $y[n]$ is the processing time of node B. Thus output signal $y[n]$ appears after the processing times of nodes A and B.

Without pipelining, the next signal $x[n+1]$ has to wait until signal $y[n]$ appears before reaching node A. In other words, signal $z[n]$ is the input to node B, and thus cannot be changed until node B completes processing. The earliest that signal $x[n+1]$ can be sent to node A is when node B completes processing, e.g., when the output signal $y[n]$ appears. As can be seen in FIG. 8A, the cycle time of the data flow graph is 2, meaning that each input signal x requires the processing times of both nodes A and B.

Figure 8B:
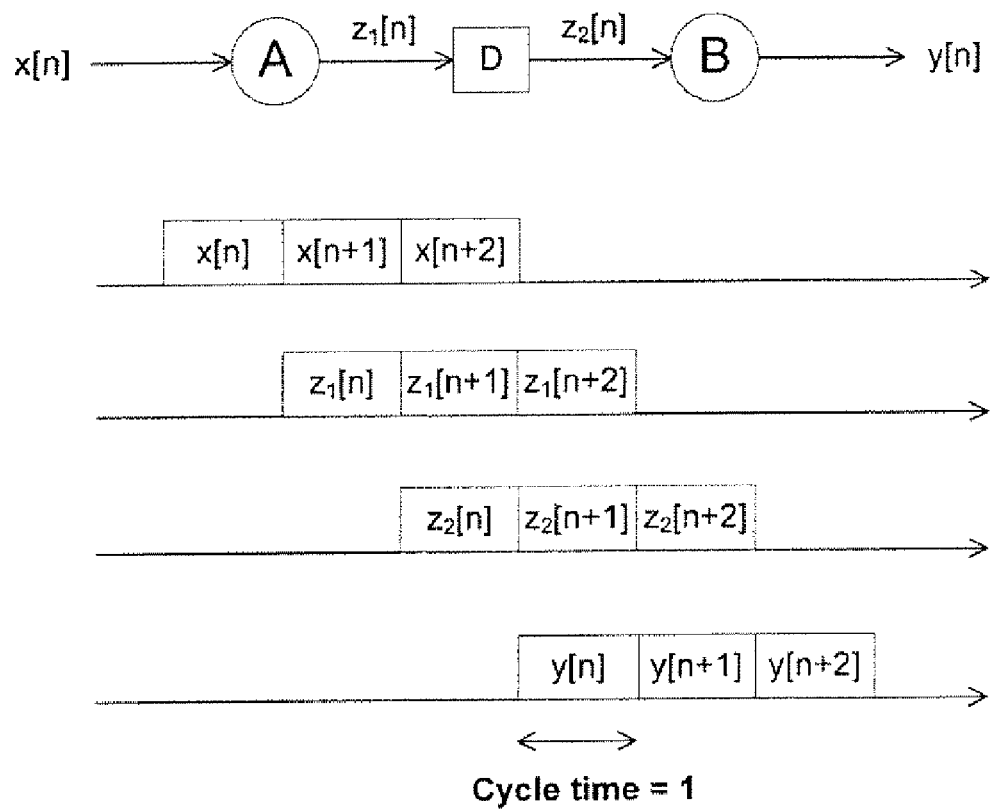

FIG. 8B illustrates the concept of pipelining as applied to the data flow graph of FIG. 8A. A delay D is introduced to the data path between node A and node B. The delay D can be sequential element such as a register, a memory cell, a flip-flop, or others. For example, a register samples and holds (stores) the input signal so that it can be output in synchronization with the clock of the circuit. Further, it is understood that one delay on an edge of a data flow graph represents a unit of latency typically introduced by the presence of a register on the corresponding path. However, the unit of latency can also be implemented through other means, such as different control signals for reading a memory cell.

With the addition of the delay D, signal $x[n]$ passes through node A after a processing time of node A to become signal $z_1[n]$. Signal $z_1[n]$ is delayed by the delay element D before outputting as signal $z_2[n]$. After processed through node B, signal $z_2[n]$ becomes output signal $y[n]$. As shown in FIG. 8B, the time between the input signal $x[n]$ and the output $y[n]$ is longer by the delay time. However, as long as node A finishes processing, the next signal $x[n+1]$ can be sent immediately, without waiting for it to propagate through node B. The input for node B is $z_2[n]$ which is not affected by the operation of node A, and only controlled by the clock to move signals through the delay element D. Thus the cycle time for the pipelining circuit of FIG. 8B is 1, meaning that each input signal x requires the processing time of either node A or node B, which ever is longer. The tradeoff of the pipelining optimization is the delay time of the initial output, meaning with the delay element D, the first output signal y would be delayed an extra delay time by the delay element D.

Alternatively, pipelining concept can be implemented with parallel processing since both techniques exploit concurrency available in the computation in different ways. Pipelining system processes the design in an interleave manner and parallel system processes the design in using duplicate hardware.

The pipelining concept can be generalized to a data flow graph. The technique is called retiming, which is also an operation at a data flow level, and includes a transformation to change the locations of delay elements in a design without affecting its input and output characteristics.

Retiming algorithms have been used to optimize a design of a circuit. Typically, a synchronous circuit works properly only when a signal propagates from one register to another along a combinational path, a path that does not include a register, such as a memory cell, a flip-flop, a delay element, etc., within a specified number of clock cycles (e.g., in one clock period). Thus, the maximum signal delay on the paths between the registers (e.g., due to the computation time of the combinational computing elements on a path and the wire delays) determines the minimum clock period in which the circuit can work properly. Registers may be placed or repositioned on a path of the circuit to reduce the maximum signal delay on the path and to reduce the clock period of the circuit. A general retiming algorithm may be used to redistribute some of the registers in the circuit, based on a timing model of the circuit to minimize the clock period.

Typically, the timing model of a circuit is obtained by putting together the timing models of the combinational computation units, delays (e.g., due to the registers), and interconnections that make up the circuit. Interconnect delays are hard to model and thus often ignored. A typical timing model for a circuit system that includes one or more circuit modules is generated from aggregating the timing models of the combinational computation units of the modules.

Algorithms for single rate retiming have been studied and formulated based on data flow graphs, for example, in "*VLSI Digital Signal Processing Systems: Design and Implementation*" by Keshab K. Parhi, pp. 91-118, Wiley-Interscience, 1999. For example, retiming algorithms include cutset retiming and pipelining. Further, there exist retiming algorithms for clock period minimization or register minimization using the data flow graph. Data flow graphs are composed of nodes that represent the combinational computation units and edges interconnecting them. Delays (e.g. registers) are represented as weights on the edges. Each node can have an execution time associated with it.

Figure 9A:
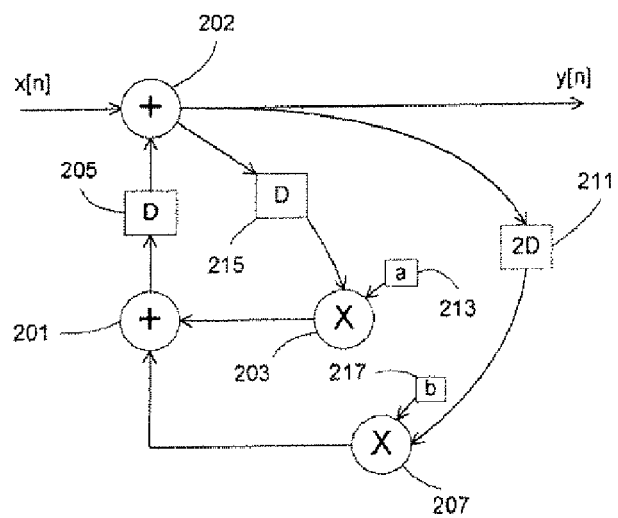
FIGS. 9A-9C illustrate a prior art method to construct a data flow graph for retiming.
Figure 9B:
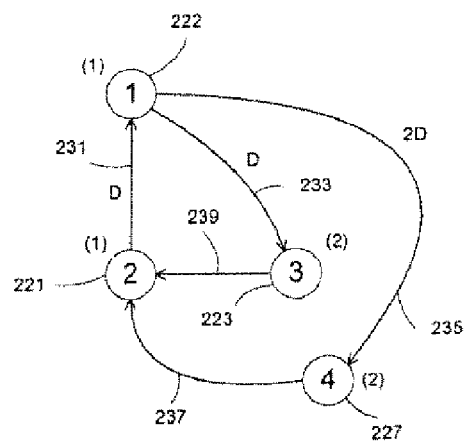
Figure 9C:
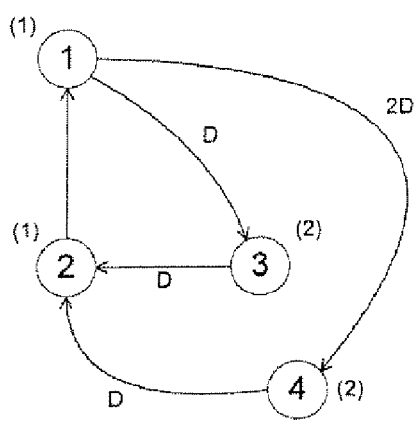

For example, FIGS. 9A-9C illustrate a method to construct a data flow graph for retiming. FIG. 9A illustrates a circuit block diagram of an IIR filter $$y[n]=ay[n-2]+by[n-3]+x[n],$$

and FIG. 9B illustrates an equivalent data flow graph. There are two adders 201 and 202, two multipliers 203 and 207, and delay registers 205, 211 and 215. The multipliers 203 and 207 have a multiplication factor a (213) and b (217), respectively. The combinational computation units (e.g., adders 201, 202, multipliers 203 and 207) in FIG. 9A are represented as nodes (e.g., nodes 221, 222, 223 and 227 in FIG. 5B). Execution time at the combinational computation units is represented by the computation time of the nodes. For example, nodes 221 and 222 each has a computation time of 1 ns, which is required by adders 201 and 202; and each of nodes 223 and 227 has a computation time of 2 ns, which is required by a multiplier (e.g., 203 or 207). Edge 231 represents the connection between adder 201 (represented by node 221) and adder 202 (represented by node 222). Edge 231 has a weight (or delay) of 1D, representing register 205 (or the one clock cycle latency due to register 205). Similarly, edge 233 has one delay D representing register 215, representing the connection between adder 202 (represented by node 222) and multiplier 203 (represented by node 223). Edge 235 represents the connection between adder 202 (represented by node 222) and multiplier 207 (represented by node 227) with 2 delay unit D. Edge 237 represents the connection between multiplier 207 (represented by node 227) and adder 201 (represented by node 221) with no delay. Edge 239 represents the connection between multiplier 203 (represented by node 223) and adder 201 (represented by node 221) with no delay.

A critical path in a data flow graph is the path with the longest computation time among all paths that contain zero delay edges (combinatorial paths). For example, in FIG. 9B, the paths from node 227 to node 221 containing edge 237 and from node 223 to node 221 containing edge 239 have zero delay. The computation time of these paths is 3 ns (of which 2 ns are for node 223/227 and 1 ns for node 221). Thus, the minimum clock period for the circuit in FIG. 9A is 3 ns.

A retiming process would include changing the locations of the delay elements (e.g., delay D in edge 231 in data flow graph 9B). FIG. 9C illustrates a retimed data flow graph, where the delay on edge 231 can be moved to edges 237 and 239. The critical path becomes the path between nodes 221 and 222, which takes only 2 ns of computation time. Thus, moving the delay from edge 233 to edges 237 and 239 allows the modified (retimed) data flow graph to be operated at a reduced clock period of 2 ns. The modified data flow graph after the retiming process optimization at a data flow level can be implemented to hardware by removing register 255 and adding a register between multiplier 203 and adder 201, and a register between multiplier 207 and adder 201.

The clock speed of the output design can be maximized, e.g. by applying a known retiming algorithm for clock period minimization. These retiming algorithms are formulated on data flow graphs. Hardware modules, often containing registers and memories, do not directly fit in as single nodes. Thus, the circuit diagram is translated into data flow graph with a combination of nodes and edges in order to sufficiently represent their timing behavior. For example, the circuit design is broken down into the actual registers and combinational computing elements that make up the module and assigning one node to each combinational computing element. Typically, circuit modules in a design are translated into a set of nodes and edges that correspond to the combinational units in the modules and the nets connecting them. In other words, the timing model of each hardware module is typically constructed by putting together the timing models of the combinational computation units, delays, and interconnections that make up the hardware module. The aggregation of the set of nodes and edges used in the translation of a particular hardware module is effectively the timing model (data flow graph) of that hardware module.

A timing model of a hardware module can be constructed using data from a detailed implementation of the data flow graph model. This data is obtained by feeding an increasing number of registers into the module; retiming (and optimizing) the hardware module; and detecting the critical path within the module as new registers are added to determine the minimum clock period of the module.

Retiming algorithm can be used to improve timing on parallel hardware, for example, to increase the clock rate of a circuit by reducing the computation time of the critical path. Retiming can also be used to decrease the number of registers in a circuit. Since retiming can affect the clock period and the number of registers, it can be used for optimize both of these parameters. Retiming can also be used to reduce the power consumption of a circuit by reducing switching, for example, by placing registers at the inputs of nodes with large capacitances can reduce the switching activities at these nodes.

Figure 10A:
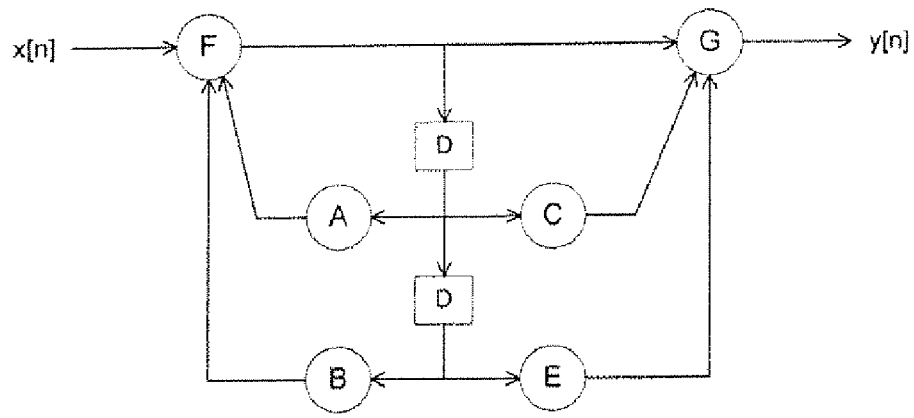
FIGS. 10A-10C illustrate an exemplary un-optimized system.
Figure 10B:
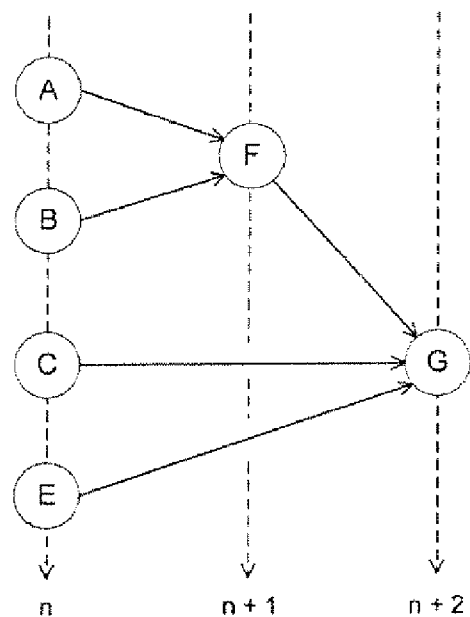
Figure 10C:
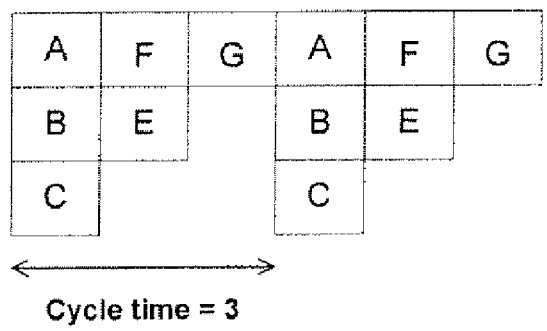

FIG. 10A illustrates a data flow graph for a second order recursive digital filter. Nodes F and G represents adders, nodes A, B, C, and E represent multipliers, and block D represents delay on the edges. From the data flow graph, the nodes cannot run in an arbitrary order. The precedence between the nodes is illustrated in FIG. 6B, which shows that nodes A and B have to be completed before node F, and nodes C, E and F have to be completed before node G. Thus, nodes A and B run first, node F runs second, and node G runs third. Nodes C and E can be distributed either in first or second. For a 3-processor scheduling as shown in FIG. 6C, the cycle time is 3.

FIG. 11A illustrates the same data flow graph after calculating and implementing a retiming algorithm where three delays are added to the edges to node G. With the retimed graph, the precedence between the node changes as shown in FIG. 11B. There are only two orders with nodes A, B, C, E, and F in one and node G in another. For scheduling and mapping to a 3-processor hardware, the cycle time is improved to 2 as shown in FIG. 11C.

Mathematical description of retiming has been studied, and algorithms for retiming a circuit to achieve certain objectives have been described. Returning to the circuit and graph of FIGS. 9A and 9B, algorithm to achieve the retimed graph of FIG. 9C is described below. In the context of retiming, the term circuit, graph and data flow graph are often used interchangeably, since the computation detail of a node is not needed for retiming.

Starting with graph of FIG. 9B, a retiming solution is characterized be a value r(V) for each node V in the graph. There are 4 nodes 1-4, and thus a retiming solution is characterized by the values of r(1), r(2), r(3) and r(4). The values of r(V) is called retimed solutions in the following description.

A characteristic of the retimed solution r(V) is that the retimed delay $d_r$ of an edge e between two nodes U and V is computed from the original delay d as followed:

$$d_r(e)=d(e)+r(V)-r(U) \quad (1)$$

Thus finding the retimed solution vector r allows the retiming of the graph. For example, a retimed solution vector for the graph in FIG. 9B is r=(0, 1, 0, 0). With this retimed solution r, the retiming delay between edges in the graph can be calculated. For example, the retiming delay of the edge between node 3 and node 2 is $$d_r(e)=d(e)+r(2)-r(3)=0+1-0=1$$

which is represented by a delay D value shown in FIG. 9C.

A retiming solution r(V) is feasible if the retimed delay $d_r(e)$ is non negative for all edges. This is called the feasibility constraint, or the retiming constraint for feasibility, for the data flow graph:

$$d_r(e)=d(e)+r(V)-r(U) \geq 0 \text{ or} \quad (2)$$

$$r(U)-r(V) \leq d(e) \text{ for all edges of the graph.} \quad (3)$$

To achieve a minimum clock period, for example, a clock period c, for the data flow graph, the computation time for the critical path has to be equal or less than c. Since the critical path has zero delay, this requirement can be reformulated so that all paths with a computation time greater than c cannot be the critical path, meaning a path with a computation time greater than c will have at least a delay. This is called the critical path constraint, or the clock period constraint, or the retiming constraint to achieve a target clock period.

For a path p from a starting node U to an end node V that has a computation time greater than c, the number of delay in this path p needs to be greater or equal to 1. The original number of delay register in path p is $$d(p)=d(e_1)+d(e_2)+ \quad (4)$$

where path p comprises edges $e_1, e_2, \ldots$. And the retiming number of delay register in path p is $$d_r(p)=d_r(e_1)+d_r(e_2)+\ldots$$

$$d_r(p)=d(e_1)+r(V)-r(A)+d(e_2)+r(A)-r(B)+\ldots+d(e_n)+r(Z)-r(U)$$

$$d_r(p)=d(p)+r(V)-r(U) \quad (5)$$

The critical path constraint requires that the retimed delay dr(p) for this path is greater or equal to 1:

$$d_r(p) \geq 1, \text{ thus} \quad (6)$$

$$r(U)-r(V) \leq d(p)-1 \quad (7)$$

for all paths of the graph has computation time greater than c.

There are many paths for with the same starting and end nodes, and thus to remove superfluous constraints, the above constraint for all the paths with the same starting node U and end node V is reduced to a constraint with $$d_{min}(p)=W(U,V). \quad (8)$$

If the constraint is satisfied with $d_{min}$, any larger number of delay register d will automatically be satisfied.

Thus the set of inequality equations for a retiming graph is:
For all edges e from a node U to a node V of a graph G:

$$r(U)-r(V) \leq d(e) \text{ feasibility constraints} \quad (3)$$

For all path p having a starting node U to an end node V that has a maximum computation time D(U,V) greater than the clock period c:

$$r(U)-r(V) \leq W(U,V)-1 \text{ clock period constraints} \quad (7)$$

The set of inequality constraint equations (feasibility and clock period constraints) can be solved by linear programming algorithm or shortest path algorithm, for example, by Bellman-Ford or Floyd-Warshall algorithm. The general approach to finding a retiming solution with the minimum clock period is to compute the value of W(U,V) and D(U,V), then sort the values of D(U,V) and perform a binary search on these values to find the retiming solution with the minimum clock period.

Generally speaking, the retiming solution r(V) for a single rate system is an integer, and thus strictly speaking, the constraint inequalities should be solved by integer linear programming. However, due to the special forms of the constraint inequalities (e.g., all r(V) have a coefficient of 1), this set of constraint inequalities can be solved by shortest path algorithm. The specific form of constraints makes it possible to solve the problem in polynomial time. The incident matrix is totally unimodular and the solution r(V) is guaranteed to be an all integer solution even without the additional integer constraints.

In the multirate system, the solution r(V) has to be additional constrained to an all integer vector, resulting in a more complex integer programming problem. For example, if node V is an upsampler, the feasibility constraint of the multirate retiming problem for an edge e from node U to node V is defined as followed:

$$r(U)-r(V)/(\text{up rate of } V) \leq d(e) \quad (9)$$

Similarly, if V is a downsampler, the feasibility constraint is defined as followed:

$$r(U)-r(V)*(\text{down rate of } V) \leq d(e) \quad (10)$$

The change in coefficients of the retimed solution r(V) causes the inequality constraints to be solved by integer linear programming instead of linear programming.

To bring back linear programming algorithm, the multirate system can be unfolded to a single rate before constructing the inequality constraints. After solving the retiming problem in linear programming for the unfolded single rate, the retimed single rate system can be folded back to a retimed multirate system. However, this algorithm can increase the problem size since an unfolded single rate system is much larger than the corresponding multirate system. Further, the re-transformation of the retimed single rate is not always feasible. The consistency of r vector to make the re-transformation successful is not currently available. Therefore this algorithm is not complete and not totally succeeded in eliminate integer linear programming usage.

In an embodiment, the present invention discloses a methodology for using the characteristics of the multirate system without transforming the graph, and for solving the multirate problem by multirate constraints. In an aspect, the present methodology discloses formulate the inequality constraints of a multirate system in a form similar to a single rate system while using the multirate constraints. The present methodology can employ shortest path finding algorithm instead of the more complex integer linear programming algorithm in finding normalized retimed solutions. For example, the coefficients of the retimed solution r(V) are all formulated to be unity, thus the multirate feasibility constraints and the multirate minimum clock period constraints are formulated in the form of r(U)−r(V). This unity coefficient formulation of a multirate system can enable the use of shortest path finding solutions, instead of integer linear programming solutions.

Figure 12:
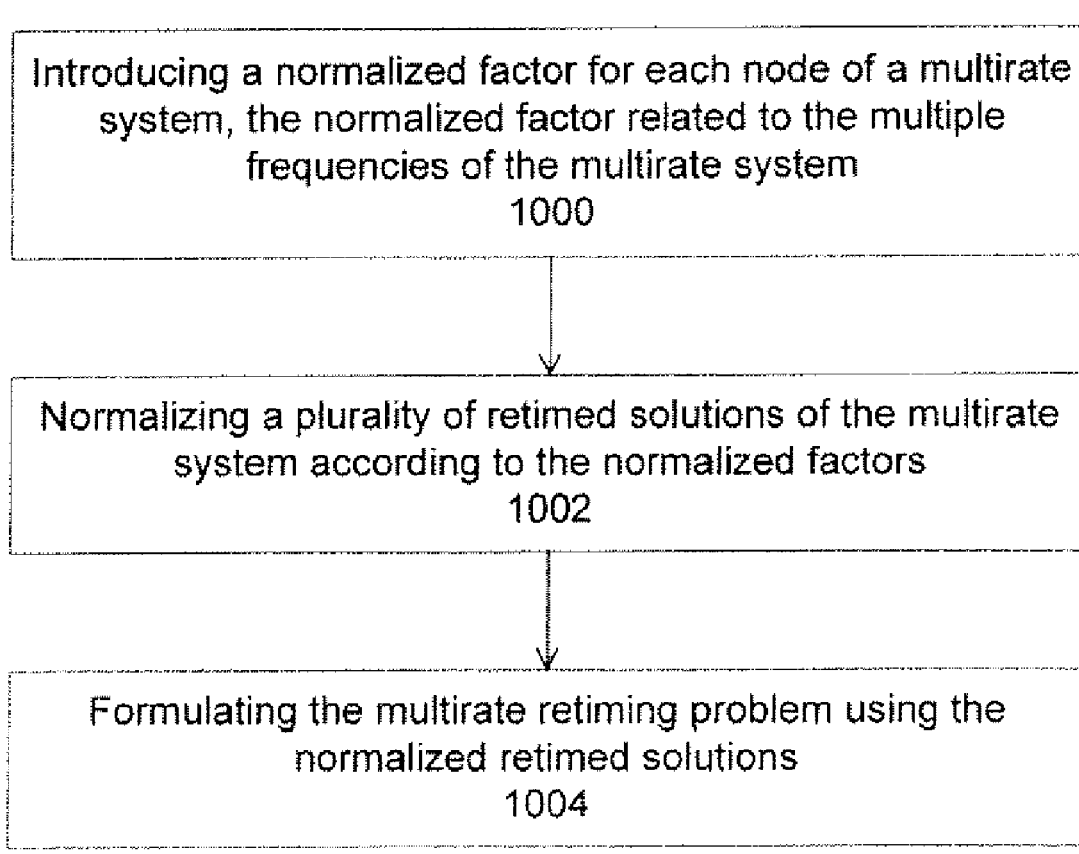
FIG. 12 shows a method for retiming a multirate system according to an embodiment of the present invention.

In an embodiment, the present methodology introduces a normalization factor vector, such as a normalized factor for each node of the multirate system, related to the multiple frequencies of the nodes of the multirate system. Alternatively, the normalized factor vector can be related to each edge of the multirate system. FIG. 12 shows a method to retime a multirate system according to an embodiment of the present invention. The multirate system can be represented by a circuit module or a data flow graph representation, for example, by representing a functional unit with a node, and by representing a data path between function units with an edge. Alternatively, a functional unit can sometimes be represented within the data flow graph representation. For the multirate system to be retimed, operation 1000 introduces a normalized factor for each node of the multirate system with the normalized factor related to the multiple frequencies of the multirate system. For example, the normalized factors are proportional to a least common multiple $f_{lcm}$ of the multiple frequencies of the multirate system. The normalized factor for a node u can also be inversely proportional to the frequency f(u) of an outgoing edge of node u. Thus in an aspect, the normalized factor $T_n$ representing a relative period for a node u is calculated as followed:

$$T_n(u) \propto f_{lcm}/f(u) \quad (11)$$

The normalized factor $T_n$ is preferably an integer, or can be integerized. Other implementations for the normalized factor $T_n$ can also be used, for example, the normalized factor can be proportional to a relative frequency for a node u, the frequency can be related to an incoming edge of node u, or can be multiplied with another factor.

In an embodiment, the normalized factors are utilized to simplify the constraint inequalities of the multirate system. Operation 1002 normalizes a plurality of retimed solutions of the multirate system according to the normalized factors. For example, the retimed solution vector r(u) can be normalized to $r_n(u)$. Operation 1004 formulates the multirate retiming problem using the retimed solutions. For example, the inequality constraints can be formulated in a linear programming form of $r_n(u)-r_n(v)$, and which can be solved by shortest path algorithm instead of integer linear programming. In an aspect, the normalized retimed solution $r_n(u)$ is designed to allow the formulation of the multirate constraints in a form similar to the single rate retiming problem using the multirate data flow graph. This will prevent an increase of problem size related to unfolding the multirate system to a single rate system.

In an embodiment, a single rate node (i.e., a node with the same incoming frequency and outgoing frequency) is normalized with the normalized factor. For example, the retimed solution r(u) is normalized with the normalized factor for a source node for an edge e. For example, given an edge e from a source node u to a destination node v, the normalized retimed solution vector $r_n$ is:

$$r_n(u)=r(u)*T_n(u) \quad (12)$$

$$r_n(v)=r(v)*T_n(u) \quad (13)$$

From the feasibility constraint of r(u)−r(v)≦d(e) of a single rate system, the feasibility constraint for a multirate system with normalized retimed solution vector $r_n$ can be formulated after multiplying both sides of the above inequality with the normalized factor $T_n(u)$:

$$r_n(u)-r_n(v) \leq d(e)*T_n(u) \quad (14)$$

Thus the normalized retimed solution $r_n(u)$ has been formulated to a form similar to the single rate system, or to a form with unity coefficient. This formulation can enable a solution based on shortest path solutions instead of integer linear programming.

In an embodiment, the delay vector d(e) of an edge is normalized with the normalized factor of either the source node or the destination node. For example, for an edge e from node u to node v where u is the source node and v is the destination node, the delay d(e) is normalized to the normalized delay $d_n(e)$ by multiplying with the normalized factor $T_n$ of the source node u.

$$d_n(e)=d(e)*T_n(u) \quad (15)$$

From the normalized delay $d_n$, the normalized retimed solution $r_n(u)$ can be formulated as:

$$r_n(u)-r_n(v) \leq d_n(e) \quad (16)$$

With the normalized retimed solutions $r_n(u)$ and the modified inequality constraints, a modified single rate formulation can be achieved for a multirate system. Further, a modified single rate algorithm can be used to solve the multirate system using the normalized retimed solutions $r_n(u)$.

The above example uses the normalized factor of a source node $T_n(u)$ in normalizing the retimed solution vector r and the edge vector d. However, the normalization is not limited to the source node u, and other implementations for the normalizing factor can be used, for example, the normalized factor of the destination node v.

The normalized factor can be proportional to the frequency of the node, for example, the up rate or the down rate of a rate change node. For example, the normalized factor can be proportional to the up rate of an upsampler node, or inversely proportional to the down rate of a down sampler node. In an aspect, the present methodology discloses a multirate consistency for a multirate node (i.e., node with different incoming frequency and outgoing frequency) where the retimed solution for the multirate node is proportional to the outgoing frequency and inversely proportional to the incoming frequency:

$r_n(u) \propto$ outgoing frequency (u)/incoming frequency (u)

The normalized factor for an upsampler node is $r_n(u) \propto$ up rate.

and the normalized factor for a downsampler node is $r_n(u) \propto$ 1/down rate In an embodiment, both normalized factors $T_n$ and outgoing/incoming frequencies can be employed. For example, the multirate consistency for a multirate node can be formulated as $r_n(u)=T_n(u)*$outgoing frequency (u)/incoming frequency (u)

Figure 13:
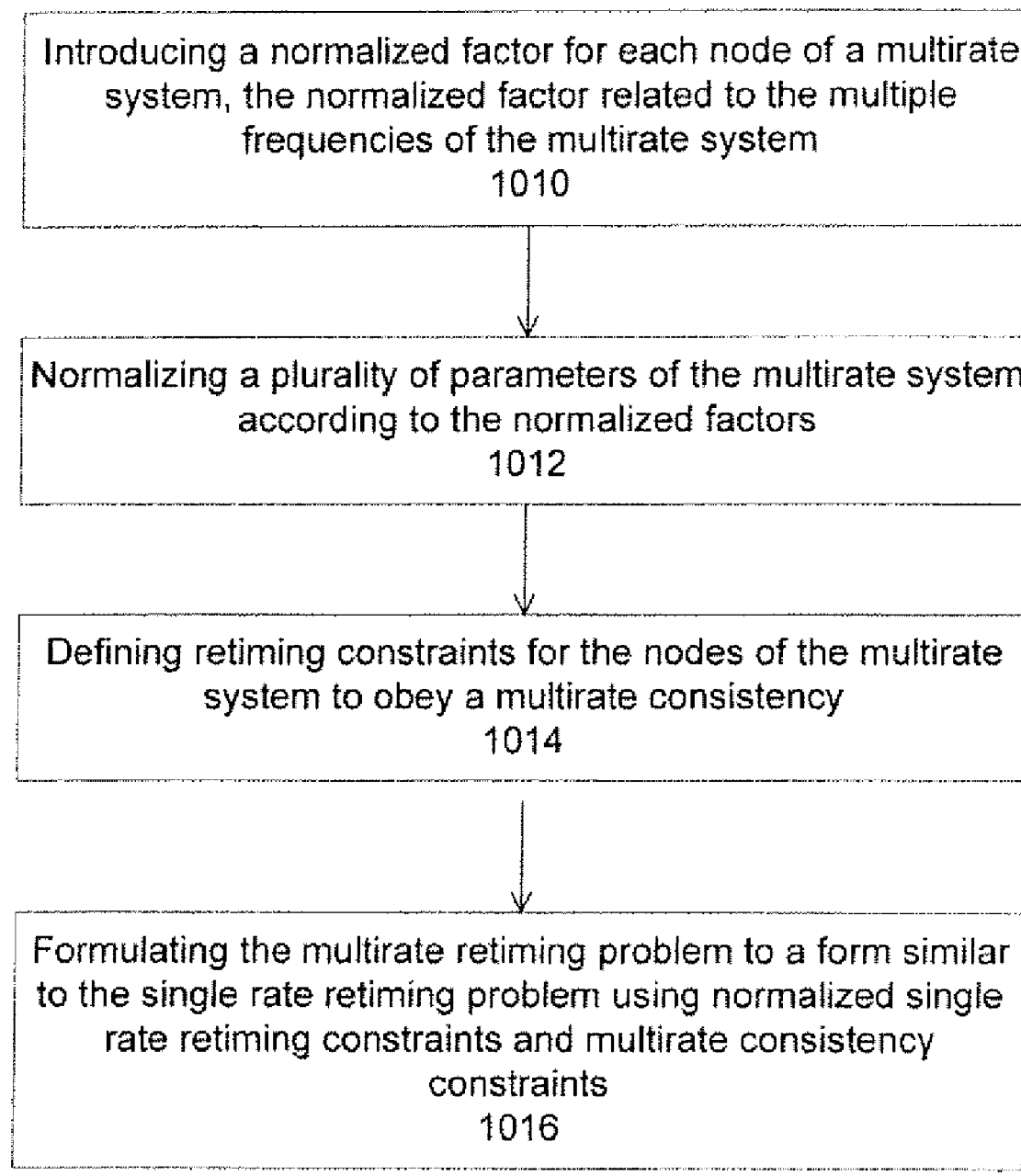
FIG. 13 shows a method for retiming a multirate system according to another embodiment of the present invention.

In an embodiment, the present methodology normalizes a plurality of parameters of a multirate system and then reformulates the multirate retiming problem to a form similar to the single rate retiming problem, e.g., enabling shortest path finding solutions or unity coefficient for the retimed solutions. FIG. 13 shows a method to retime a multirate system according to an embodiment of the present invention. For the multirate system to be retimed, operation 1010 introduces a normalized factor for each node of the multirate system with the normalized factor related to the multiple frequencies of the multirate system. Operation 1012 then normalizes a plurality of parameters of the multirate system according to the normalized factors. In an aspect, the normalized parameters include edge delay, target clock period and retimed solutions. A parameter can be normalized to one or a plurality of normalized values. For example, an edge delay can be normalized to a normalized edge delay with the normalized factor of a source node. The target clock period c can be normalized to a plurality of normalized target clock periods $c_n(v)=c^*T_n(v)$, one for each node, such as the target clock period for a destination node in a path.

The normalized target clock periods can be utilized in formulating the retiming constraints to achieve the target clock period. In a path $p(v_0, v_1, \ldots, v_k)$ which starts with node $v_0$, continues to node $v_1$, etc., and ends at node $v_k$, the total processing time t(p) for the path p is the sum of the execution time t(v) for all the nodes in the path:

$$t(p)=\Sigma_{v \text{ is a node of } p} t(v) \tag{17}$$

In an aspect, the normalized target clock period $c_n(V)$ is defined to be the product of the target clock period with the normalized factor for the end node $v_k$ of a path p:

$$c_n(v_k)=c^*T_n(v_k) \tag{18}$$

A modified retiming constraints to achieve the target clock period according to an aspect of the present invention is that a path p with the total execution time t(p) greater than the normalized target clock period for the end node $v_k$, the path is not a critical path. Thus the condition for critical path constraint is $$t(p)>c_n(v_k)=\text{target clock period}^*T_n(v_k) \tag{19}$$

Operation 1014 defines retiming constraints for the nodes of the multirate system to obey a multirate consistency. For example, in a multirate system where the clock frequency is only changed through the upsamplers or downsamplers, the frequency increases through an upsampler, and decreases through a downsampler. The normalized retimed solution $r_n(u)$ for a node that is not an upsampler or a downsampler is a product of the retimed solution r(u) and the normalized factor for that node. In other words, the remainder of the normalized retimed solution $r_n(u)$ divided by the normalized factor is zero:

$$r_n(u)=r(u)^*T_n(u), \text{ or} \tag{20a}$$

$$r_n(u) \% T_n(u)=0 \tag{20b}$$

If the node is an upsampler, the normalized retimed solution $r_n(u)$ for that node is a product of the retimed solution r(u), the up rate of the upsampler, and the normalized factor for that node. In other words, the remainder of the normalized retimed solution $r_n(u)$ divided by the product of the normalized factor and the up rate of the upsampler is zero:

$$r_n(u)=r(u)^*T_n(u)^*(\text{up rate of upsampler}) \tag{21a}$$

$$r_n(u) \% (T_n(u)^*(\text{up rate of upsampler}))=0 \tag{21b}$$

If the node is a downsampler, the normalized retimed solution $r_n(u)$ for that node is a product of the retimed solution r(u) and the normalized factor for that node, and divided by the down rate of the downsampler. In other words, the remainder of the normalized retimed solution $r_n(u)$ divided by the division of the normalized factor and the down rate of the downsampler is zero:

$$r_n(u)=r(u)^*T_n(u)/(\text{down rate of downsampler}) \tag{22a}$$

$$r_n(u) \% (T_n(u)/(\text{down rate of downsampler}))=0 \tag{22b}$$

These multirate consistency constraints provide the consistency for the change in frequencies of a node through an upsampler or a downsampler. The multirate consistency constraint further provides the feasibility constraint for a multirate system in a form similar to the single rate system. For example, the multirate feasibility constraint for an edge e having a normal node u and an upsampler node v is $$r(u)-r(v)/(\text{up rate of } v) \leq d(e) \tag{9}$$

Using the present normalized retimed solution for an upsampler, the above multirate feasibility constraint is converted to:

$$r_n(u)-r_n(v) \leq d_n(e) \tag{23}$$

which is the same as (16).

For system having rate change nodes where the frequency changed by another operation function, the rate change node can be modeled by using downsamplers and upsamplers, and the above multirate consistency constraints can be utilized. In general, any multirate node can be modeled with upsamplers and downsamplers, thus the above multirate consistency constraint is not a limitation to a generic multirate system. In addition, other forms of multirate consistency can be used.

Operation 1016 then formulates the multirate retiming problem to a form similar to the single rate retiming problem, using the normalized single rate retiming constraints and the multirate consistency constraints. For example, the normalized single rate retiming constraints include the retiming constraints for feasibility ($r_n(u)-r_n(v) \leq d_n(e)$), which is formulated with normalized factors in a form similar to the single rate system.

The retiming constraints to achieve a target clock period in the form of single rate system for the normalized parameters can be formulated similar to the formulation of the inequality constraints of the single rate.

Figure 14:
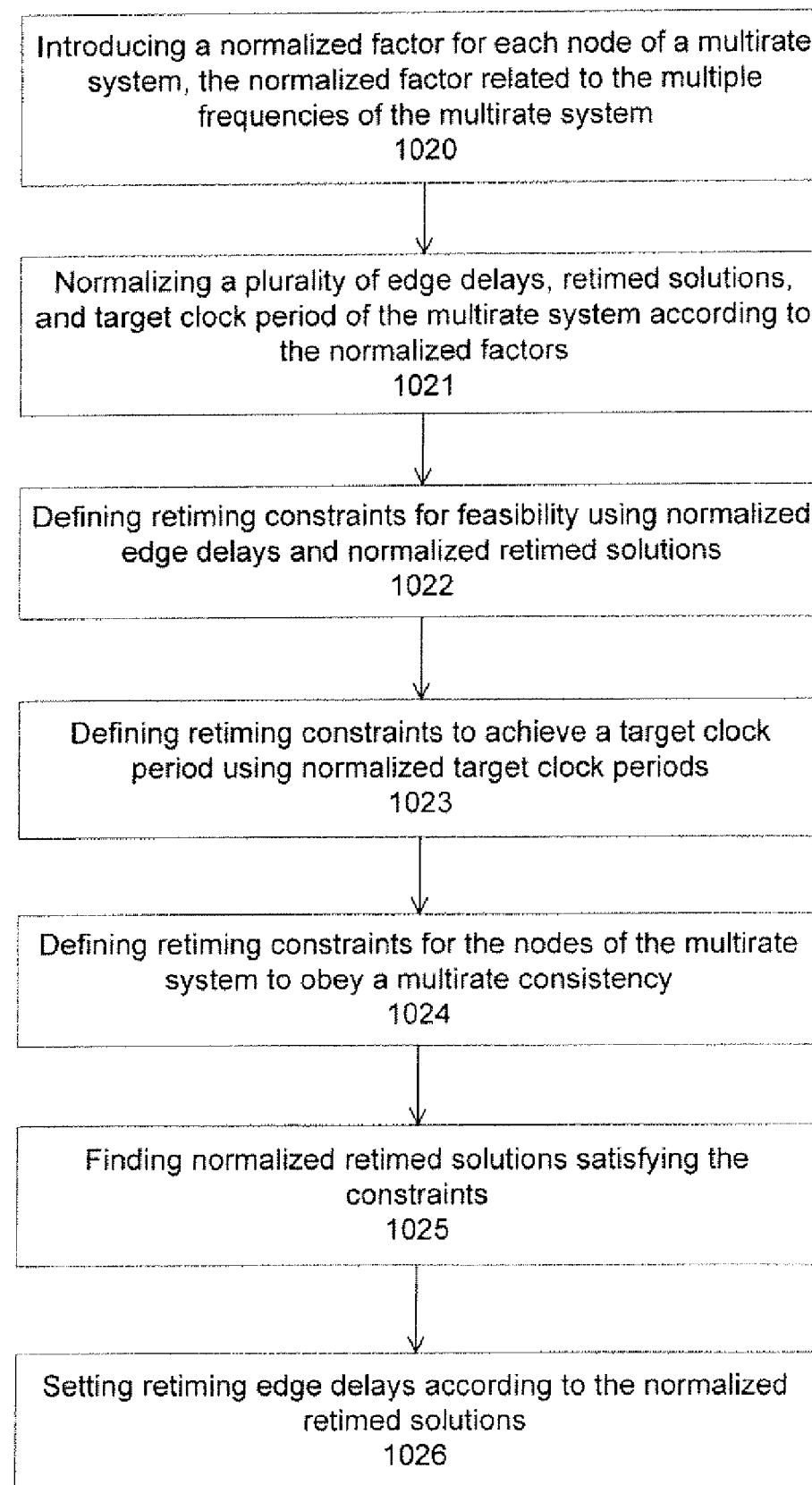
FIG. 14 shows a preferred method for retiming a multirate system according to an embodiment of the present invention.

In a preferred embodiment, the present methodology solves the retiming problem of a multirate system such as a DSP system, to achieve a given clock period in a computationally efficient way, and with a computational complexity comparable to that of a single rate system. FIG. 14 shows a method to retime a multirate system according to a preferred embodiment of the present invention. The multirate system is represented by a multirate directed graph G(V, E, d, t, f), with V representing the nodes, E representing the edges between the nodes, d showing the delays on each edge, t representing the processing or execution time on each node, and f representing the clock frequency of outgoing edges of each node. Operation 1020 introduces a normalized factor for each node of the multirate system with the normalized factor related to the multiple frequencies of the multirate system. An exemplary normalized factor is $T_n(v)=f_{lcm}/f(v)$, which is a relative period vector, proportional to the least common multiple $f_{lcm}$ of the frequencies of the nodes in the graph G, and inversely proportional to the frequency of node v. Operation 1021 then normalizes a plurality of edge delays, retimed solutions, and target clock period of the multirate system according to the normalized factors. For example, an edge delay can be normalized to a normalized edge delay with the normalized factor of a source node. The target clock period c can be normalized to a plurality of normalized target clock periods according to a destination node in a path, $c_n(v)$ with v being the destination node in a path p. The retimed solution r(v) can be normalized to $r_n(v)$ according to the frequency at an outgoing edge of the node v. In an aspect, for multirate consistency, the normalized retimed solution $r_n(v)$ for an upsampler is further proportional to the up rate of the upsampler, and the normalized retimed solution $r_n(v)$ for a downsampler is inversely proportional to the down rate of the downsampler. Further, alternatives to the normalized parameters can also be implemented, for example, an edge delay is normalized to the incoming edge of a node, the target clock period is normalized according to a source node of a path, and the retimed solution is normalized according to the frequency at an incoming edge.

Operation 2022 defines retiming constraints for feasibility using normalized edge delays $d_n(e)$ and normalized retimed solution $r_n(v)$. The feasibility constraints can be put in a form similar to that of a single rate system using the normalized parameters to eliminate integer linear programming usage.

$$r_n(u) - r_n(v) \leq d_n(e) \tag{23}$$

This feasibility constraint is derived from the desire to simplify the retiming problem of multirate system. This is the present innovative variation of the feasibility constraint for an upsampler or a downsampler, which are $$r(u) - r(v)/(\text{up rate of } v) \leq d(e) \text{ and} \tag{9}$$

$$r(u) - r(v)*(\text{down rate of } v) \leq d(e) \tag{10}$$

The utilization of normalized factors for the retimed solution causes the coefficients of the normalized retimed solution $r_n(v)$ all becoming unity, and thus can be solved by shortest path algorithm, instead of integer linear programming as in prior art.

Operation 1023 defines retiming constraints to achieve a target clock period. Similar to the feasibility constraints, the critical constraints can be put in a form similar to that of a single rate system using the normalized parameters to eliminate integer linear programming usage.

In an embodiment, the present invention discloses a simple but not sub-optimal method to define the clock constraints. In an aspect, the constraints are defined according to the destination clock period, or the destination node of the path p. Thus a normalized target clock period can be defined as $c_n(v_k) = (\text{target clock period})^*T_n(v_k)$.

Consider a path $p(v_0, v_1, \ldots, v_k)$ started with node $v_0$ and ended with node $v_k$, and consisted of edges ($v_0 \to v_1$, $v_1 \to v_2$, $\ldots$, $v_{k-1} \to v_k$). Thus for each path p, the critical constraint is applied if the total processing time t(p) (17) for the path p is greater than the normalized target clock period $c_n(v_k)$:

$$t(p) \geq (\text{target clock period})^*T_n(v_k)$$

In an aspect, the normalized clock period constraint is derived from the clock period constraint (7) for single rate system, by multiplying with the normalized factor vector, where W(p) is the minimum delay for path p $$(r(v_0) - r(v_k)) \leq W(p) - 1)^*T_n$$

$$r_n(v_0) - r_n(v_k) \leq W_n(p) - T_n \tag{24}$$

In an aspect, a minimum normalized factor $T_{min}(p)$ can be used $$r_n(v_0) - r_n(v_k) \leq W_n(p) - T_{min}(p)$$

$T_{min}(p)$ is the minimum of the normalized factors within the path p:

$$T_{min}(p) = \min \{T_n(v_0), T_n(v_1), \ldots, T_n(v_k)\}$$

In an aspect, $W_n(p)$ is the total normalized weight (or delay) of the path, which can be calculated as:

$$W_n(p) = \Sigma_{e \text{ is an edge of } p} d_n(e)$$

Any other normalized factor can be used, for example, a maximum normalized factor for the path p, $T_{max}(p)$, or any normalized factor for a node x in the path p, $T_n(x)$, and a maximum value for the total normalized weight (or delay) of the path p, $W_{nmax}(p)$. The maximum value of $W_n$ and the minimum value of $T_n$ can remove superfluous constraints for the constraints of (24).

The number of paths in a graph is non polynomial according to the graph size, therefore it would not be efficient to perform the above clock period constraint setting directly. In an aspect, a graph search algorithm can be applied to solve the single source shortest path problem. Because a feasible system should not have any algebraic loop, and there is not any negative cycle in the graph, thus in an aspect, Dijkstra's algorithm can be used.

In an embodiment, the present constraint setting can prevent superfluous constraint generation. For example, consider the path $p(v_0, v_1, \ldots, v_k)$. If the total processing time t(p) of the path p exceeds the normalized clock period (target clock period$^*T_n(v_k)$), then the clock period constraint between $v_0$ and $v_k$ should be defined. But if the path $p_2(v_0, v_1, \ldots, v_{k-1})$, which is a sub path of p, also exceeds the timing constraint, i.e., $t(p_2) > (\text{target clock period}^*T_n(v_{k-1}))$, then there should also be a timing constraint between $v_0$ and $v_{k-1}$. The constraint of $p_2$ makes the constraint of p unnecessary, meaning the constraint of p becomes superfluous. In an aspect, the present algorithm prevents this superfluous constraint, limiting the number of constraints in the order of O(E). If the superfluous constraints are defined, then the number of constraints is limited by $O(V^2)$.

Dijkstra's algorithm is well known, searching for the vertex u in the set V that has the least dist(u) value. Dist is a vector of lexicographically ordered triplet (W, tNeg, $T_{min}$) where tNeg is the negative of t(p). It is negated to use lexicographical comparison. The algorithm uses Q, which is a min-priority queue, supporting operations INSERT, IsEMPTY, EXTRACT-MIN, DELETE. The following is an exemplary code:

```
For each node src
{
    i. For each node u
    ii. {
        1. Dist(u).W = INF
        2. Dist(u).tNeg = INF
        3. Dist(u).T_min = INF
    iii. }
    iv. Dist(src).W = 0
    v. Dist(src).tNeg = -t(src);
    vi. INSERT(Q, Dist(src))
    vii. While !IsEmpty(Q)
    viii. {
        1. minDist = EXTRACT-MIN(Q)
        2. u = owner node of the minDist
        3. if (minDist. tNeg + target_clk * T_n(u) < 0)
        4. {
            a. if ( minDist. tNeg + target_clk * T_n(u) + t(src) >= 0)
                i. define r_n(src) - r_n(u) <= minDist.W -
                   minDist.T_min;
        5. }
        6. else //else is used to prevent superfluous constraints
        7. {
            a. for each outgoing edge of u : e (u -> v)
            b. {
                i. REMOVE(Q, Dist(v))
```

```
            ii. RELAX(e, u, v, Dist)
            iii . INSERT(Q, Dist(v))
         c. }
      8. }
   ix. }
}
```

The function RELAX is defined as follows:

```
RELAX(e, u, v, Dist)
{
      x. newDistOfV.W = Dist(u).W + d_n(e)
     xi. newDistOfV.tNeg = Dist(u).tNeg – t(v)
    xii. newDistOfV.T_min = MIN(Dist(u).T_min, T_n(u))
   xiii. if( Dist(v) < newDistOfV)
            1. Dist(v) = newDistOfV
}
```

If a proper Q data structure is used, worst case run time complexity of the above clock period constraint definition algorithm is $O(V.E.\log(V))$, which is polynomial. The memory requirement of this algorithm is $O(V+E)$.

Operation 1024 defines retiming constraints for the nodes of the multirate system to obey a multirate consistency. In an aspect, the multirate consistency constraints apply to upsamplers, downsamplers, or both samplers. In an embodiment, the multirate consistency for upsamplers constrains the normalized retime solution $r_n(u)$ for node u to be a multiple of the up rate of the upsampler and the normalized factor of node u.

In an embodiment, other multirate nodes can be converted to upsamplers and downsamplers, before using the consistency constraints of upsamplers and downsamplers.

The set of retiming constraints, containing feasibility constraints, clock period constraints, and multirate consistency constraints, can be solved to get the normalized retimed solution $r_n(u)$. Operation 1025 finds the normalized retimed solutions satisfied the retiming constraints for the multirate system. A modified algorithm is used to solve the above constraints. In an aspect, the modified algorithm introduces a dummy source node to the directed graph G to form the directed graph $G_t$, and calculates the distance vector for the edges. If $G_t$ contains a negative cycle, the algorithm exits with an infeasibility sign. Then the algorithm searches for the shortest path from the dummy source node to all other nodes to find the normalized retimed solution $r_n$ satisfying the formulated constraints. The following is an exemplary algorithm:

```
Create a directed graph G_t(V_t, E_t, d_t)
{
V_t is the nodes of the G_t. it is equal the original V and a dummy source node.
E_t is the edges of the G_t. d_t is the distance vector of the edges ( i.e. d_t(e) shows the
distance on e). E_t and d_t are built as following:
         i. For each node u in V_t except dummy source node
        ii. {
                  1. Put a connection (e) from dummy source node to u.
                  2. Define d_t(e) = 0
       iii. }
        iv. For each feasibility or clock period constraint (r_n(u) – r_n(v) <= c)
         v. {
                  1. Put a connection (e) from node u to node v.
                  2. Define d_t(e) = c.
        vi. }
}
If G_t contains a negative cycle
   b. return sign of infeasible retiming
else
{
For each node u
         i. r_n(u) = 0
noOfRateChangers = total number of upsamplers or downsamplers in G.
passCnt = 0
do
{
        ii. IsRetimingFeasible = 1;
       iii. passCnt ++
        iv. For each node u except dummy source node
         v. {
                  1. e = the edge from dummy source node to u
                  2. d_t(e) = r_n(u) //(using the outgoing edge distance of dummy
                     source node to set a lower limit to shortest path is a critical
                     contribution of the invention. This lower limit setting is used to
                     find an r_n that does not contradict with the multirate constraints.)
        vi. }
       vii. Find shortest paths from dummy source node to all other node.
      viii. For each node u except dummy source node
        ix. {
                  1. r_n(u) = shortest path distance from dummy source node to u
                  2. if u is an upsampler
                        a. baseValue = T_n(u) * (up-rate of upsample)
                  3. else
                        a. baseValue = T_n(u)
                  4. if (r_n(u) % baseValue != 0)
                  5. {
                        a. IsRetimingFeasible = 0
                        b. r_n(u) = floor(r_n(u) / baseValue) * baseValue (floor is
```

```
                                    used because r_n vector has non-positive values)
            6. }
        x. }
    } until (IsRetimingFeasible or passCnt > noOfRateChangers )
    If (! IsRetimingFeasible)
            xi.  return sign of infeasible retiming
    else
            xii. return r_n vector
}
```

The worst case run time complexity of above algorithm to find feasible $r_n$ vector is $O(V.E.\log(V))$ which is polynomial. The memory requirement is $O(V+E)$. If the superfluous constraint generation is not prevented, the timing complexity of the algorithm would increase significantly to $O(V^3.\log(V))$ and the memory requirement to $O(V^2)$.

After finding the normalized retimed solution vector $r_n$, operation 1026 sets retimed edge delays according to the normalized retimed solutions. In an aspect, the retimed edge delay vector $d_r(e)$ for an edge e between a source node u and a destination node v is calculated as followed:

$$d_r=d+(r_n(v)-r_n(u))/T_n(u)$$

The present invention discloses reformulation of the multirate retiming problem and the simplifications within the solution of the reformulated problem. The present constraint inequalities can be solved by shortest path algorithm without unfolding the multirate system to single rate system. The multirate problem is solved in the present algorithm by multirate constraints. The present algorithm can eliminate integer linear programming usage without any sub optimality with the present innovative clock period setting definition. The present algorithm also consider the critical path break capability of registers on a faster clock domain, for example, in a multirate path having a faster clock in the middle (i.e. there is a faster clock on the path more then source and end of the path). The present clock period setting definition can provide optimal constraint formulation, taking advantage of slower clock domain. The present algorithm also discloses a way to eliminate superfluous constraints, providing more efficient algorithm in terms of computational time and memory usage.

The present algorithm can increase the practically solvable multirate DSP system size by at least an order of magnitude. It is also easier to implement and less error prone than prior algorithms, eliminating integer linear programming usage which is computationally more complex. Further, to find the clock period constraints, unfolding of multirate system is not needed, which reduces additional complexity and graph size. As a result, the present algorithm can solve larger multirate retiming problems in shorter time without any optimality tradeoff.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method to retime a multirate system, comprising:
    introducing a normalized factor for each node of the multirate system represented by a data flow graph having a plurality of nodes, the normalized factors related to the multiple frequencies of the multirate system;
    normalizing a plurality of edge delays, retimed solutions, and target clock period of the multirate system according to the normalized factors;
    defining first retiming constraints for feasibility using normalized edge delays and normalized retimed solutions;
    defining second retiming constraints to achieve target clock period using normalized target clock periods;
    defining third retiming constraints for the multirate nodes of the multirate system to be a function of the frequencies of the outgoing and incoming edges of said nodes;
    finding normalized retimed solutions that satisfy the first, second, and third retiming constraints; and
    setting retimed edge delays according to the normalized retimed solutions wherein one or more operations above performed by a data processing system.

2. The method as in claim 1 wherein a shortest path algorithm, and not an integer linear programming algorithm, is used for finding normalized retimed solutions.

3. The method as in claim 1 wherein the normalization factors are proportional to the least common multiple of the multiple frequencies of the multirate system.

4. The method as in claim 1 wherein the normalization factor for each node of the multirate system is inversely proportional to the frequency of an outgoing edge of said node.

5. The method as in claim 1 wherein the normalized retiming constraints for the multirate system are derived from the constraint formulations using normalized parameters.

6. The method as in claim 1 further comprising a graph search algorithm to remove superfluous constraints.

7. The method as in claim 1 wherein defining third retiming constraints for multirate nodes comprises defining a retimed solution for an upsampler node to be a function of a normalized factor and the up rate of the upsampler.

8. The method as in claim 1 wherein defining third retiming constraints for multirate nodes comprises defining a retimed solution for a downsampler node to be a function of a normalized factor and the down rate of the downsampler.

9. The method as in claim 1 wherein a multirate node of the multirate system is converted to a plurality of upsamplers, downsamplers and single rate nodes.

10. The method as in claim 1 wherein a modified single rate algorithm is used to solve the multirate problem using normalized factors.

11. A machine readable non-transitory medium containing executable computer program instructions which when executed by a digital processing system cause said system to perform a method to retime a multirate system, the method comprising:
    introducing a normalized factor for each node of the multirate system represented by a data flow graph having a plurality of nodes, the normalized factors related to the multiple frequencies of the multirate system;

normalizing a plurality of edge delays, retimed solutions, and target clock period of the multirate system according to the normalized factors;

defining first retiming constraints for feasibility using normalized edge delays and normalized retimed solutions;

defining second retiming constraints to achieve target clock period using normalized target clock periods;

defining third retiming constraints for the multirate nodes of the multirate system to be a function of the frequencies of the outgoing and incoming edges of said nodes;

finding normalized retimed solutions that satisfy the first, second, and third retiming constraints; and setting retimed edge delays according to the normalized retimed solutions.

12. The non-transitory medium as in claim 11 wherein a shortest path algorithm, and not an integer linear programming algorithm, is used for finding normalized retimed solutions.

13. The non-transitory medium as in claim 11 wherein the normalization factors are proportional to the least common multiple of the multiple frequencies of the multirate system.

14. The non-transitory medium as in claim 11 wherein the normalization factor for each node of the multirate system is inversely proportional to the frequency of an outgoing edge of said node.

15. The non-transitory medium as in claim 11 wherein the normalized retiming constraints for the multirate system are derived from the constraint formulations using normalized parameters.

16. The non-transitory medium as in claim 11 further comprising a graph search algorithm to remove superfluous constraints.

17. The non-transitory medium as in claim 11 wherein defining third retiming constraints for multirate nodes comprises defining a retimed solution for an upsampler node to be a function of a normalized factor and the up rate of the upsampler.

18. The non-transitory medium as in claim 11 wherein defining third retiming constraints for multirate nodes comprises defining a retimed solution for a downsampler node to be a function of a normalized factor and the down rate of the downsampler.

19. The non-transitory medium as in claim 11 wherein a multirate node of the multirate system is converted to a plurality of upsamplers, downsamplers and single rate nodes.

20. The non-transitory medium as in claim 11 wherein a modified single rate algorithm is used to solve the multirate problem using normalized factors.

21. The non-transitory data processing system to retime a multirate system, the data processing system comprising:

means for introducing a normalized factor for each node of the multirate system represented by a data flow graph having a plurality of nodes, the normalized factors related to the multiple frequencies of the multirate system;

means for normalizing a plurality of edge delays, retimed solutions, and target clock period of the multirate system according to the normalized factors;

means for defining first retiming constraints for feasibility using normalized edge delays and normalized retimed solutions;

means for defining second retiming constraints to achieve target clock period using normalized target clock periods;

means for defining third retiming constraints for the multirate nodes of the multirate system to be a function of the frequencies of the outgoing and incoming edges of said nodes;

means for finding normalized retimed solutions that satisfy the first, second and third retiming constraints; and means for setting retimed edge delays according to the normalized retimed solutions.

22. The system as in claim 21 wherein a shortest path algorithm, and not an integer linear programming algorithm, is used for finding normalized retimed solutions.

23. The system as in claim 21 wherein the normalization factors are proportional to the least common multiple of the multiple frequencies of the multirate system.

24. The system as in claim 21 wherein the normalization factor for each node of the multirate system is inversely proportional to the frequency of an outgoing edge of said node.

25. The system as in claim 21 wherein the normalized retiming constraints for the multirate system are derived from the constraint formulations using normalized parameters.

26. The system as in claim 21 further comprising a graph search algorithm to remove superfluous constraints.

27. The system as in claim 21 wherein defining third retiming constraints for multirate nodes comprises defining a retimed solution for an upsampler node to be a function of a normalized factor and the up rate of the upsampler.

28. The system as in claim 21 wherein defining third retiming constraints for multirate nodes comprises defining a retimed solution for a downsampler node to be a function of a normalized factor and the down rate of the downsampler.

29. The system as in claim 21 wherein a multirate node of the multirate system is converted to a plurality of upsamplers, downsamplers and single rate nodes.

30. The system as in claim 21 wherein a modified single rate algorithm is used to solve the multirate problem using normalized factors.

* * * * *